United States Patent [19]

Ikushima et al.

[11] Patent Number: 4,720,682

[45] Date of Patent: Jan. 19, 1988

[54] SURFACE ELECTRIC POTENTIAL SENSOR

[75] Inventors: Hiroshi Ikushima; Yoshitsugu Uenishi, both of Hirakata; Yuzo Eto, Neyagawa; Masashi Kanno, Katano, all of Japan

[73] Assignee: Matsushita Electric Industrial Co., Ltd., Osaka, Japan

[21] Appl. No.: 803,216

[22] Filed: Nov. 27, 1985

[30] Foreign Application Priority Data

Nov. 29, 1984 [JP] Japan ................................. 59-252209
Nov. 29, 1984 [JP] Japan ................................. 59-252210

[51] Int. Cl.⁴ ............................................. G01R 29/12
[52] U.S. Cl. ....................................... 324/458; 324/457
[58] Field of Search ................................ 324/457, 458

[56] References Cited

U.S. PATENT DOCUMENTS 4,147,981 4/1979 Williams ............................. 324/458
4,205,267 5/1980 Williams .

FOREIGN PATENT DOCUMENTS 57-133360 8/1982 Japan .

OTHER PUBLICATIONS

Yokoyama, Masaaki and Mikawa, Hiroshi, "On Manufacture of a Simple Processor for Surface Potential", Journal of Society of Electrophotography of Japan, Jan. 22, 1983, pp. 52–55.

"Surface Potential Sensor", NEC Technical Journal, vol. 36, No. 1/1983, p. 132.

Primary Examiner—Reinhard J. Eisenzopf
Assistant Examiner—Robert W. Mueller
Attorney, Agent, or Firm—Wenderoth, Lind & Ponack

[57] ABSTRACT

A surface electric potential sensor for detecting an electric potential on a surface of an object without contacting the surface. The sensor comprises a tuning fork having a base and legs formed of a single elastic body, piezoelectric vibrators respectively mounted on the legs, double-layer structure electrodes respectively provided on ends of the legs and each comprising an insulating substrate and a high conductive film, a supporting board, and a shield case which has a window for introducing therethrough lines of electric force radiated from the surface of the object. The tuning fork is mounted at the base on the upper surface of the supporting board. An electric circuit may be also mounted on the upper surface of the supporting board. As the tuning fork is vibrated by the piezoelectric vibrators, the electrodes moves so as to open and close the window of the shield case.

5 Claims, 10 Drawing Figures

FIG. 3(a)    FIG. 3(b)
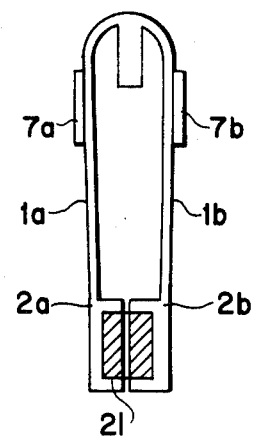
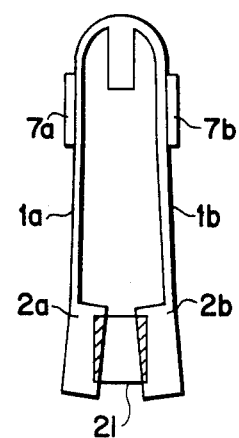
FIG. 4(a)    FIG. 4(b)
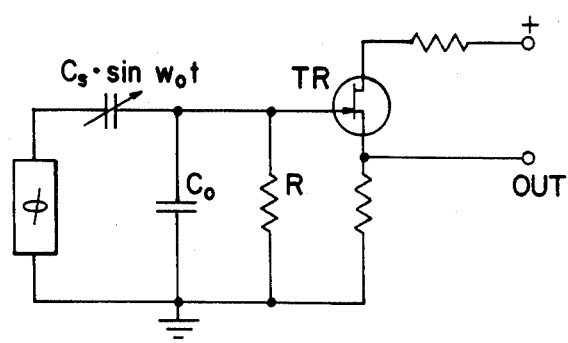
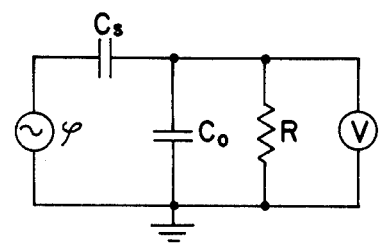

SURFACE ELECTRIC POTENTIAL SENSOR

BACKGROUND OF THE INVENTION

1. Field of the Invention

The present invention relates to a surface electric potential sensor for detecting an electric potential on a surface of an object without contacting the surface. There are two types of surface electric potential sensors—one is a sector type which chops the lines of electric force by a grounded high conductive member, and the other is a vibrating-reed electrometer (VREM) type which periodically changes the capacitance between the surface to be measured and an electrode reed receiving the lines of electric force. The present invention relates particularly to the VREM type surface electric sensor.

2. Description of the Prior Art

There is a vibrating-reed type electrometer which uses a needle electrode mounted on the tip of one leg of a tuning fork driven by a piezoelectric vibrator as an electrode for receiving the line of electric force emitted from a surface of an object to be measured. Since a measuring probe mounting therein the needle electrode is relatively large in size and extremely expensive, this type of electrometer is usually used not for simple monitoring but for test (standard) measurement. Examples of this type are disclosed in U.S. Pat. No. 4,205,267 (Reference (1)) and Electrophotography, the Journal of the Society of Electrophotography of Japan, Vol. 8 (1983), No. 1, p. 52 (Reference (2)).

On the other hand, a simple surface electric potential sensor of the sector type is in the market. This sensor uses a metal tuning fork as an electric field chopper and receives the line of electric force by a stationary electrode. Since the sensor installs parts of a signal amplifier circuit on both surfaces of a printed circuit board (PCB) for holding the tuning fork, it is complicated in structure (difficult to be produced) and requires a large casing. The sensor is disclosed in NEC Technical Journal, Vol. 36 (1983), No. 1, p. 132 (Reference (3)).

As a VREM type sensor, such a sensor has been proposed that uses a leg of a metal tuning fork as an electrode for receiving the line of electric force. In this sensor, since the base of the tuning fork is made of an insulating material different from the material of the legs, it is difficult to integrally manufacture the base and legs in order to facilitate vibrations of the tuning fork which is the main element of the sensor. Further, it is not easy to match acoustic impedance between the base and legs of the tuning fork, so that the vibration efficiency of the tuning fork is low. Furthermore, since a piezoelectric vibrator necessary for driving the tuning fork is provided on only one of the two legs, the vibration efficiency cannot be made high. As a result, the sensitivity (S/N ratio) of the sensor is deteriorated because the reduction of the tuning fork vibration efficiency, providing the vibration frequency be constant, causes a decrease in vibration amplitude of the tuning fork, which means that the range of capacitance changes between the electrode and the surface to be measured reduces. This sensor is disclosed in Japanese Laid-Open Patent Application 57-133360 (Reference (4)).

SUMMARY OF THE INVENTION

An object of the present invention is to provide a surface electric potential sensor which is relatively small-sized, inexpensive, and capable of simply monitoring a surface electric potential.

Another object of the present invention is to provide a surface electric potential sensor which has a simple structure to be produced easily.

Still another object of the present invention is to provide a surface electric potential sensor which has a high sensitivity to a surface electric potential.

In order to achieve the above objects, a surface electric potential sensor of the invention comprises: a tuning fork made of a single body of a hard elastic material; a piezoelectric vibration element mounted on each leg of the tuning fork at a position near a base of the tuning fork for vibrating the tuning fork; a double-layer structure body comprising an insulating substrate mounted on a free end of each leg of the tuning fork and a high conductive film provided on the insulating substrate; a supporting board for supporting the tuning fork at the base; and a shield case for encasing therein the tuning fork, the shield case has a window for introducing lines of electric force radiated from a surface of an object to be measured so that the high conductive film accepts the lines of electric force. The high conductive film serves as an electrode for receiving the lines of electric force.

In the aforesaid construction of the invention, since the base and legs of the tuning fork are formed of the same material, integrally with each other, it is easy to drive the tuning fork. Simultaneously, acoustic impedances at the base and legs are easy to match, so that the vibration efficiency of the tuning fork does not deteriorate. Also, since the tuning fork is driven by the piezoelectric vibration elements provided on the both legs, the vibration efficiency of the tuning fork is improved. Accordingly, a high sensitivity to the surface electric potential can be obtained.

Preferably, the supporting board may be a PCB mounting on one main surface thereof an electric circuit together with the tuning fork. Since the electric circuit and the tuning fork are mounted on only one main surface of the supporting board and therefore the other main surface of the supporting board is free, it is further preferable to use the supporting board as a bottom plate of the shield case.

Since the components of the sensor are disposed entirely on the one main surface of the supporting board, a printed wiring pattern is easily formed on the board (PCB), and also mounting processes of the tuning fork and the electric circuit components are simple. Further, since the supporting board serves also as the bottom plate of the shield case, the shield case is simple to house therein the sensor components, resulting in that the sensor is made small-sized.

These and other objects and features of the invention will become more apparent from the following description taken in connection with the accompanying drawings in which:

BRIEF DESCRIPTION OF THE DRAWINGS

FIGS. 3(a) and (b) are front views explanatory of the operation of a tuning fork used in the surface electric potential sensor of the invention;

FIGS. 4(a) and (b) are an equivalent circuit diagram and a simplified equivalent circuit diagram of the surface electric potential sensor of the invention, respectively.

DESCRIPTION OF THE PREFERRED EMBODIMENT

Figure 1:
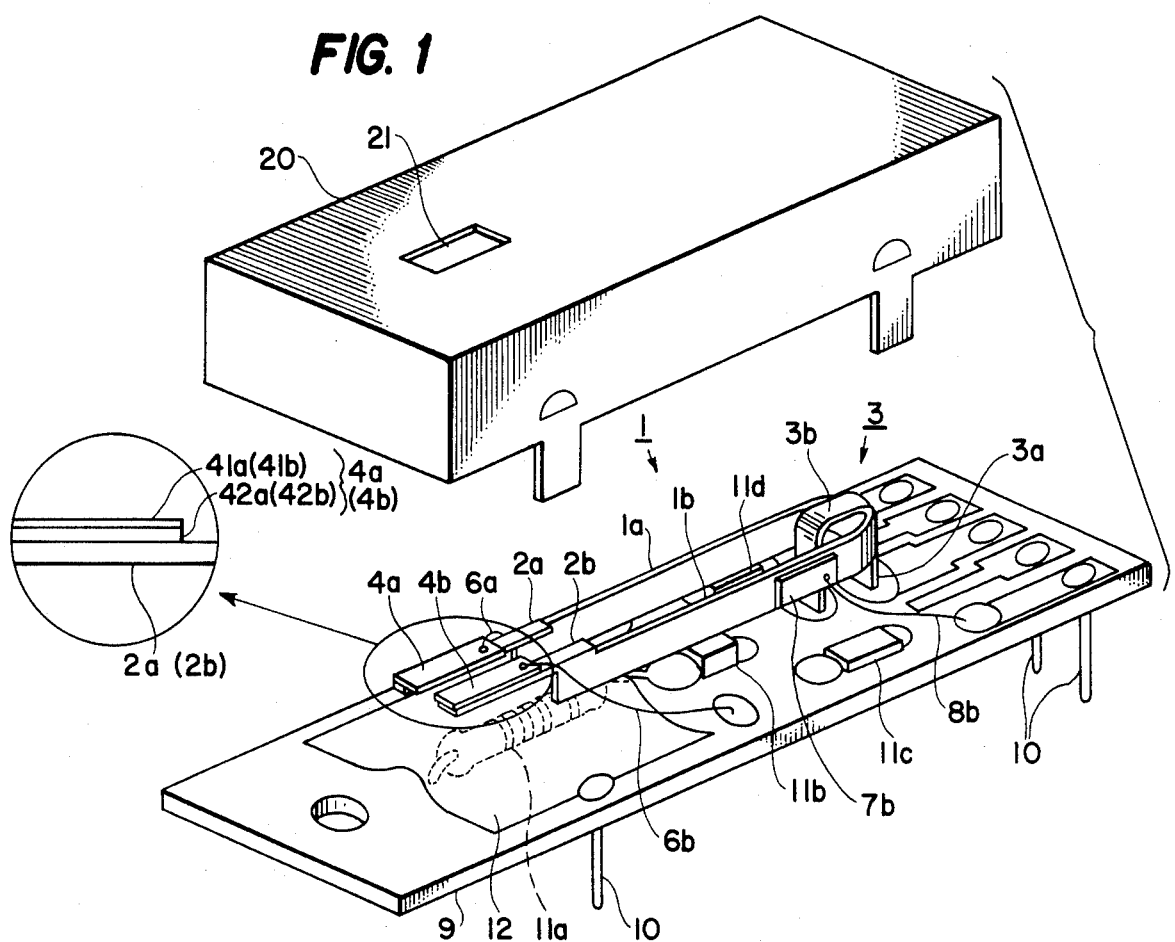
FIG. 1 is a perspective view of an embodiment of surface electric potential sensor of the invention.
Figure 2A:
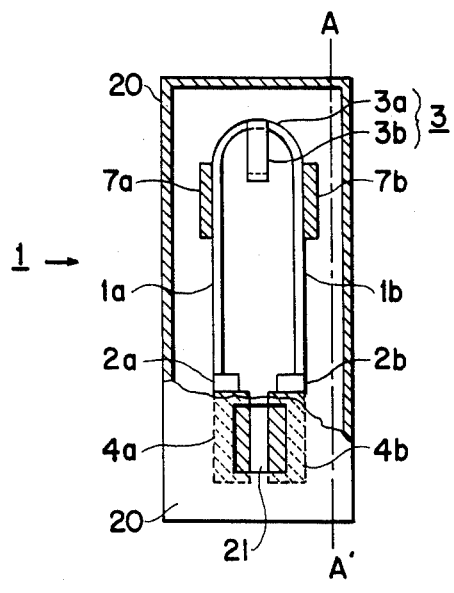
FIGS. 2(a) and (b) are a partially cutaway front view and a sectional side view of the principal structure of the FIG. 1 embodiment respectively.

FIG. 1 is a perspective view of an embodiment of surface electric potential sensor of the invention, in which an upper lid 20 is uncovered. FIGS. 2(a) and (b) show the main portion of the surface electric potential sensor in FIG. 1, in which FIG. 2(a) is a partially cutaway front view and FIG. 2(b) is a sectional view taken along a line A—A' in FIG. 2(a).

Figure 2B:
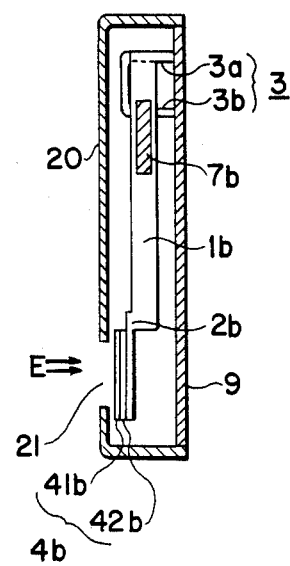

Referring to FIGS. 1, 2(a) and 2(b), reference numeral 1 designates a tuning fork comprising both legs 1a and 1b with respective utmost end portions 2a and 2b, and a base 3. The tuning fork 1 is driven by piezoelectric vibrators 7a and 7b mounted on the legs 1a and 1b respectively. Reference numerals 8a and 8b designate lead wires for supplying drive voltages to the piezoelectric vibrators 7a and 7b respectively. The base 3 of the tuning fork 1 comprises leg members 3a and 3b extending in opposite directions perpendicularly to the bending direction of the legs 1a and 1b, the leg member 3a being fixed as it is to an upper surface of a printed circuit board (PCB) 9, the leg member 3b being gradually bent to be in parallel to the leg member 3a and fixed to the upper surface of the PCB 9. Thus, the tuning fork element 1 can be produced simply by cutting and bending one permanent elastic alloy plate. Also, since the legs and base are made of the same material, the acoustic impedances of the legs and base easily match therebetween to thereby improve the vibration efficiency of the tuning fork.

The utmost end portions 2a and 2b of the legs 1a and 1b are bent so that the main surfaces thereof oppose to a window 21 provided at the upper lid 20 for introducing lines of electric force E radiated from a surface of an object to be measured (not shown). Electrodes 4a and 4b for receiving the lines of electric force are provided on the main surfaces of the end portions 2a and 2b respectively. Each of the electrodes 4a and 4b has a double-layer structure comprising a high conductive film 41a or 41b and an insulating substrate 42a or 42b. The high conductive films 41a and 41b are opposite to the window 21 and electrically connected to a circuit on the upper surface of the PCB 9 through lead wires 6a and 6b respectively.

On the upper surface of the PCB 9 are mounted circuit components 11a to 11d constituting a detection signal amplification circuit, the component 11a disposed below the electrodes 4a and 4b being covered by a shielding member 12. Also, external electrode pins 10 project downwardly from the PCB 9. Drive signals for driving the piezoelectric vibrators 7a and 7b are supplied from an external circuit (not shown) through one of the external electrode pins 10, and a surface electric potential detection signal is amplified by the amplification circuit on the PCB 9 and supplied to the external circuit through another of the pins 10.

A conductive film (not shown) is provided on the substantial area of the lower surface of the PCB 9 so that the PCB 9 functions also as a bottom shield plate. Accordingly, the upper lid 20 and the PCB 9 constitute a shield case of the sensor. The PCB 9 is preferably thick and mechanically strong as the bottom plate.

Next, explanation will be given on operation of the surface electric potential sensor of the invention constructed as above. When the piezoelectric vibrators 7a and 7b vibrating in the lengthwise direction are expanded, the legs 1a and 1b at the tuning fork element 1 bend toward each other so that the utmost end portions 2a and 2b of the legs 1a and 1b are positioned to close the window 21 as shown in FIG. 3(a). When the piezoelectric vibrators 7a and 7b contract, the legs 1a and 1b move away from each other so that the utmost end portions 2a and 2b are positioned to open the window 21. Hence, the lines of electric force E passing through the window 21 are stored as electric charges on the high conductive films 41a and 41b, and the charges, in synchronism with the vibration of the tuning fork 1, are converted into a displacement current flowing in a load which is an element of the amplification circuit. Therefore, an electric potential on the surface to be measured (represented by the lines of electric force) is obtained as a voltage produced at a resistor having a predetermined resistance by the displacement current.

FIG. 4(a) is an equivalent circuit diagram of a measuring system comprising the surface to be measured and the surface electric potential sensor, in which: reference 100 designates a DC potential on the surface to be measured; Co designates a stray capacitance between the electrode surface of the sensor and the ground; Cs designates a maximum value of variation with time of a stray capacitance between the electrode surface of the sensor and the surface to be measured; $\omega_o$ designates an angular frequency of the tuning fork; R designates a resistance component of an output impedance with respect to a sensor output signal; and TR designates an amplification transistor. The output signal of the sensor is fetched as a voltage V expressed as:

$$V = Vo + \epsilon \sin \Omega t \qquad (1)$$

$$\left. \begin{array}{l} \Omega = \omega_o \, (\phi: DC) \\ = \omega \text{ (angular frequency of the surface)} \\ \quad \text{electric potential) } (\phi: AC) \end{array} \right\} \qquad (2)$$

where Vo and $\epsilon$ are constants.

The equivalent circuit in FIG. 4(a), when in the normal condition, is represented by an equivalent circuit as shown in FIG. 4(b), in which reference $\psi$ designates an AC conversion signal of $\phi$. Referring to FIG. 4(b), the output signal V of the sensor is given by the following equation:

$$V = k \left( \frac{(1 + j\Omega CoR)^{-1}}{(1 + j\Omega CoR)^{-1} + (J\Omega CsR)^{-1}} \right) \psi \qquad (3)$$

From the equation (3), the absolute value of V is given by the following equation:

$$|V| = k\Omega CsR[1 + \{\Omega(Cs+Co)R\}^2]^{-\frac{1}{2}} \cdot |\psi| \qquad (4)$$

The approximation of the equation (4) corresponding to the limit values of $\Omega$ is given by the following equation:

$$|V| = k\Omega C_s R \cdot |\psi| \quad (\Omega << 1) \tag{5}$$

$$|V| = kC_s(C_s + C_0)^{-1} \cdot |\psi| \quad (\Omega >> 1) \tag{6}$$

Thus, the electric potential on the surface to be measured can be obtained by the equations (5) and (6).

Figure 5A:
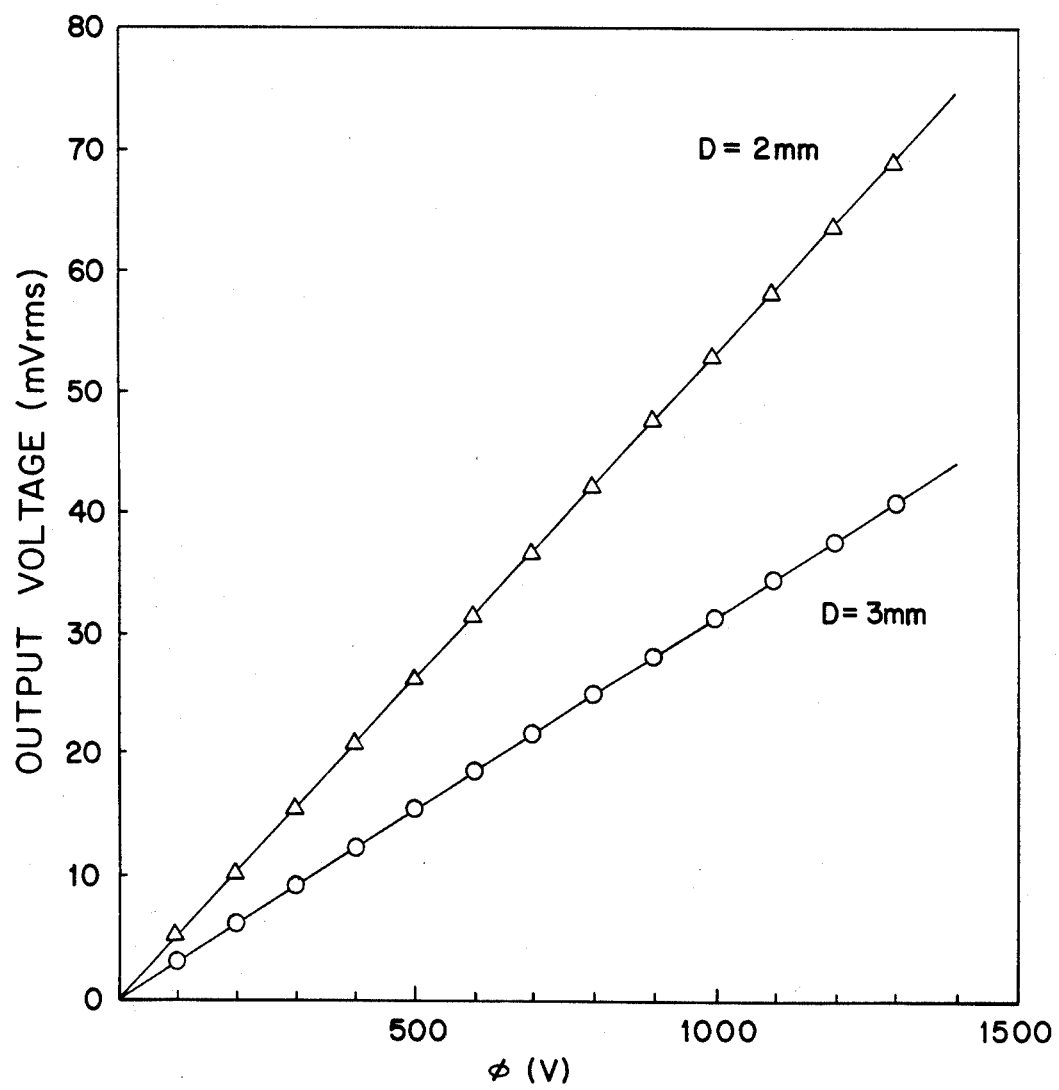
FIGS. 5(a), (b) and (c) are graphs of the fundamental characteristics of the surface electric potential sensor of the invention, showing the high electric potential characteristic, the low electric potential characteristic and the alternating electric potential characteristic, respectively.
Figure 5B:
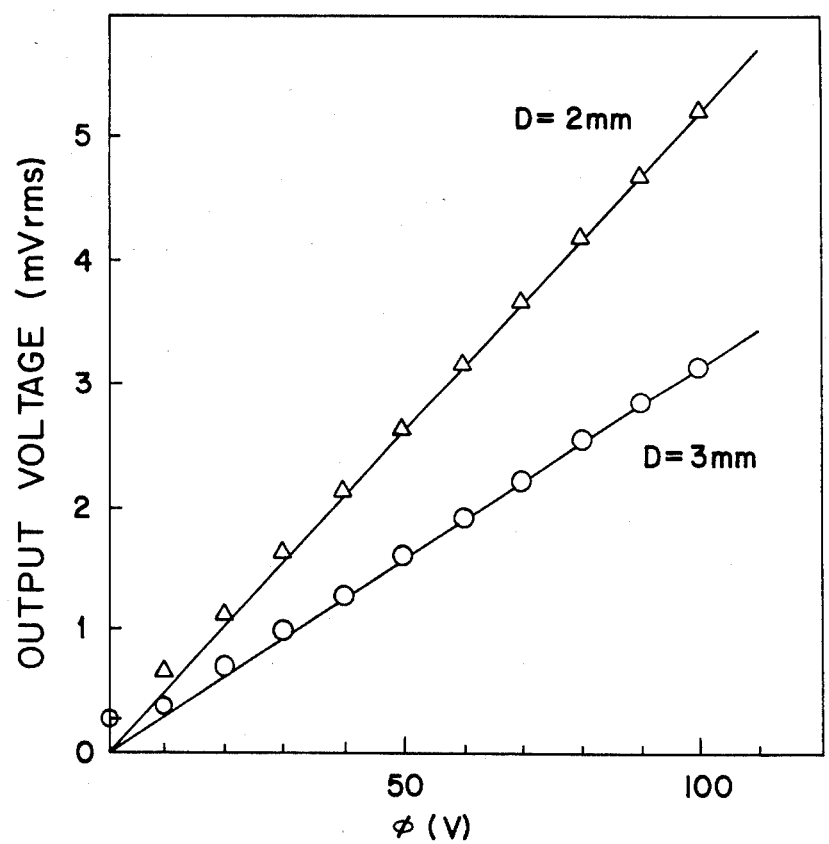
Figure 5C:
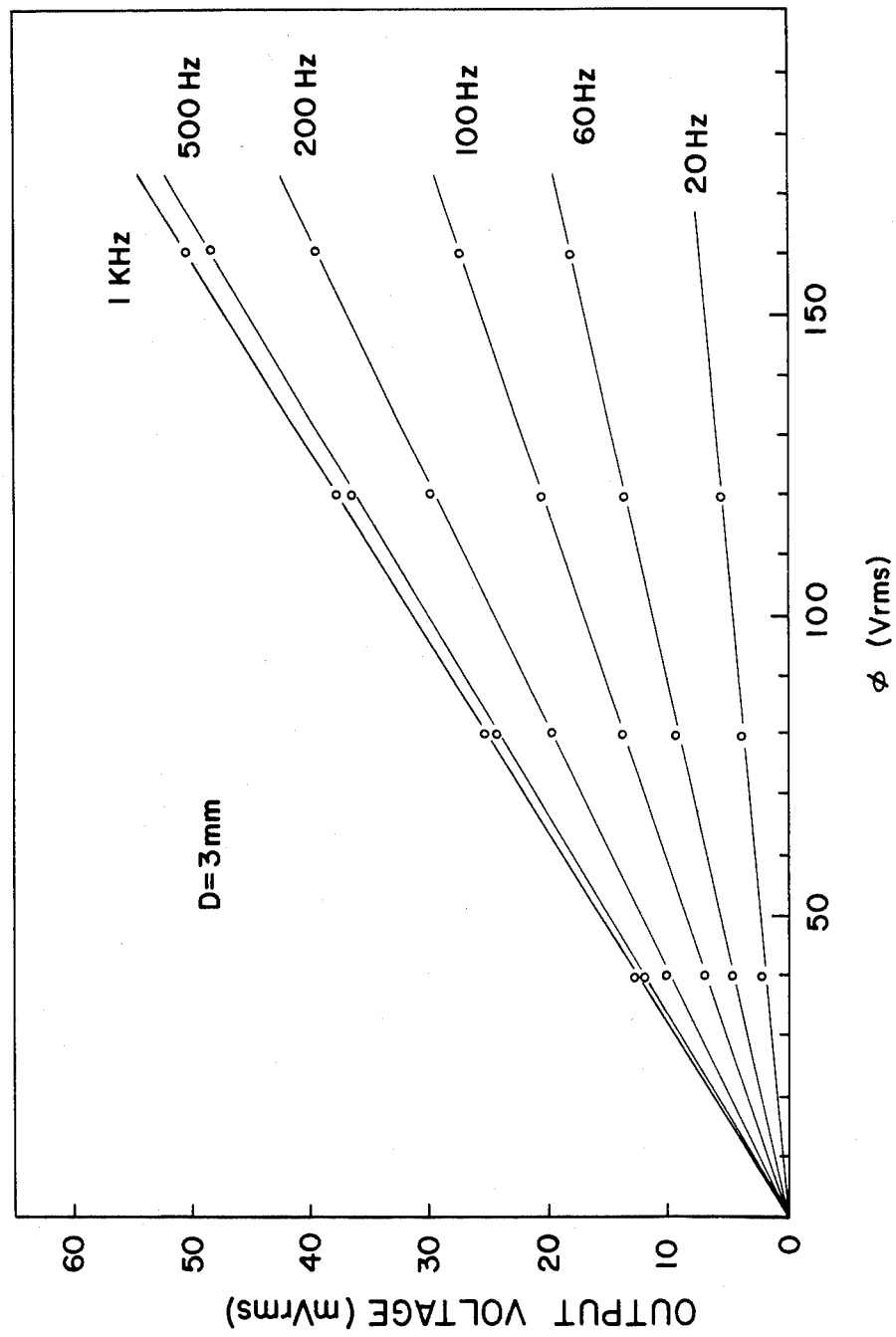

FIGS. 5(a), (b) and (c) are basic characteristic diagrams of the surface electric potential sensor of the invention, in which FIG. 5(a) shows a high potential characteristic, FIG. 5(b) a low potential characteristic, and FIG. 5(c) an alternating potential characteristic. Reference D designates a distance between the window 21 and the surface to be measured. These characteristic diagrams apparently show high sensitivity and superior linearity.

According to the present invention, since the potential detecting electrodes 4a and 4b for receiving the lines of electric force can be disposed adequately close to the window 21 for introducing the lines of electric force, S/N ratio of the sensor is improved. For, the amount of charges produced at each of the electrodes 4a and 4b is inversely proportional to the distance between the electrode (4a or 4b) and the surface to be measured. In other words, when the distance between the window 21 and the surface to be measured is fixed, the surfaces of the measuring electrodes of the sensor according to the invention are disposed closer to the window 21 than those of the conventional example (Reference (3)), so that the distance between the surface to be measured and the surfaces of the measuring electrodes is reduced to that extent. Thus, the amount of produced electric charges increases to that extent thereby to increase the quantity of electric signal, resulting in easy signal processing by the circuit.

It is easily understood that the sensor of the invention is superior to the conventional example (Reference (3)) in the following points:

(1) Since the principal components are concentrated on one surface of the PCB, mounting thereof is easy.

(2) Since the PCB serves as the bottom plate of the shield case, the sensor size can be made small.

Furthermore, the sensor of the invention is more advantageous than the conventional example (Reference (4)) in that the two electrodes respectively provided on the two legs of the tuning fork improve S/N ratio more than the conventional example which has one electrode, because the amount of the produced charges, when the size of one electrode is fixed, becomes about two times that of the conventional example, so that the electric signal becomes larger to that extent and the signal processing by the circuit is easy. Of course, the sensor of the invention is more advantageous than the conventional example (Reference (4)) in the following points:

(1) Since the base and legs of the tuning fork are formed integrally of the same material, the tuning fork can be produced easily.

(2) For the same reason, acoustic impedance matching between the base and legs is easy.

(3) The tuning fork is driven by the two vibrators provided on the both legs.

Hence, the vibration efficiency is improved to lead to a further improvement of S/N ratio.

Typical specifications of the surface electric potential sensor of the invention are shown in Table 1.

TABLE 1

| Specifications of surface electric potential sensors | | |
|---|---|---|
| Type | Sample 1 | Sample 2 |
| System frequency | 500 ± 20 (Hz) | |
| Source voltage | 10~15 (Vdc) | |
| Measurable potential* | 30~3000 (Vdc) | 100~3000 (Vdc) |
| Operating temperature | 0~70 (°C.) | |
| Storage temperature | −20~70 (°C.) | |
| Dimensions | 41 × 13.6 × 6.5 mm | 30 × 9 × 7.2 mm |
| Mounting method | Screw fixing | Soldering to PCB |

(*Distance from an object surface to be measured: 3 mm)

While a preferred embodiment of the invention has been described, such description is for illustrative purpose only, and it should be understood that various changes and modifications may be made without departing from the spirit and scope of the invention described in the appended claims.

What is claimed is:

1. A surface electric potential sensor for detecting an electric potential on a surface of an object without contacting the surface, comprising:

a tuning fork made of a single body of a hard elastic material having a base and two legs extending from said base;

a piezoelectric vibration element mounted on each of said legs at a position near said base for vibrating said tuning fork so that free ends of said legs move alternately toward and away from each other;

an electrode having a double-layer structure comprising an insulating substrate mounted on each of said free ends of said legs and a high conductivity film provided on said insulating substrate;

a supporting board for supporting said tuning fork at said base; and a shield case for encasing therein said tuning fork, said shield case having a window for introducing lines of electric force radiated from said surface so that said high conductivity film accepts said lines of electric force;

wherein said high conductivity film alternately opens and closes said window according to vibrations of said tuning fork so as to thereby produce a displacement current corresponding to said lines of electric force.

2. A sensor according to claim 1, wherein said piezoelectric vibration element vibrates in its lengthwise direction.

3. A surface electric potential sensor for detecting an electric potential on a surface of an object without contacting the surface, comprising:

a tuning fork made of a single body of a hard elastic material having a base and two legs extending from said base;

a piezoelectric vibration element mounted on each of said legs at a position near said base for vibrating said tuning fork so that free ends of said legs move alternately toward and away from each other;

an electrode having a double-layer structure comprising an insulating substrate mounted on each of said free ends of said legs and a high conductivity film provided on said insulating substrate;

an electric circuit connected to said high conductivity film for processing an electric signal produced by said high conductivity film;

a supporting board for mounting on one main surface thereof said base of said tuning fork and said electric circuit; and a shield case for covering said tuning fork and said electric circuit, said shield case having a window for introducing lines of electric force radiated from said surface of said object so that said high conductivity film accepts said lines of electric force;

wherein said high conductive film alternately opens and closes said window according to vibrations of said tuning fork so as to thereby produce a displacement current corresponding to said lines of electric force as said electric signal, said displacement current being converted by said electric circuit into a voltage signal corresponding to said electric potential.

4. A sensor according to claim 3, wherein said piezoelectric vibration element vibrates in its lengthwise direction.

5. A sensor according to claim 3, wherein said supporting board is provided with a conductive film on a substantial area of the other main surface thereof so as to function as a bottom shield plate.

* * * * *